(12) United States Patent
Tanaka

(10) Patent No.: US 8,084,844 B2
(45) Date of Patent: Dec. 27, 2011

(54) SEMICONDUCTOR DEVICE

(75) Inventor: Takuji Tanaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 281 days.

(21) Appl. No.: 12/504,655

(22) Filed: Jul. 16, 2009

(65) Prior Publication Data
US 2009/0273039 A1    Nov. 5, 2009

Related U.S. Application Data

(62) Division of application No. 11/505,418, filed on Aug. 17, 2006, now abandoned.

(30) Foreign Application Priority Data

Mar. 30, 2006   (JP) ................................. 2006-093275

(51) Int. Cl.
  H01L 21/70   (2006.01)
  H01L 21/02   (2006.01)
  H01L 29/02   (2006.01)
  H01L 27/085  (2006.01)

(52) U.S. Cl. ........ 257/547; 257/372; 257/373; 257/548; 257/549; 257/550; 257/E27.06

(58) Field of Classification Search .................. 257/390, 257/39, E27.062, 372–373, 548–500, E27.06
See application file for complete search history.

(56) References Cited

U.S. PATENT DOCUMENTS

| 6,194,776 B1 * | 2/2001 | Amano et al. ................ 257/550 |
| 6,891,207 B2 * | 5/2005 | Pequignot et al. ............ 257/173 |
| 7,282,770 B2 * | 10/2007 | Tanaka et al. ................ 257/371 |
| 7,313,779 B1 * | 12/2007 | Masleid et al. ............... 716/120 |
| 7,514,728 B2 * | 4/2009 | Sugahara et al. ............. 257/206 |
| 7,759,740 B1 * | 7/2010 | Masleid et al. ............... 257/371 |
| 2005/0230781 A1 * | 10/2005 | Ema et al. ..................... 257/510 |

(Continued)

FOREIGN PATENT DOCUMENTS

JP    60-206164    10/1985

(Continued)

OTHER PUBLICATIONS

USPTO, (KALAM) Non-Final Rejection, Apr. 16, 2009, in parent U.S. Appl. No. 11/505,418 [now abandoned].

(Continued)

Primary Examiner — Zandra Smith
Assistant Examiner — Jeremy Joy
(74) Attorney, Agent, or Firm — Fujitsu Patent Center

(57) ABSTRACT

A semiconductor device in which potential is uniformly controlled and in which the influence of noise is reduced. A p-type well region is formed beneath a surface of a p-type Si substrate. n-type MOS transistors are formed on the p-type well region. An n-type well region is formed in the p-type Si substrate so that it surrounds the p-type well region. A plurality of conductive regions which pierce through the n-type well region are formed at regular intervals. By doing so, parasitic resistance from the p-type Si substrate, through the plurality of conductive regions, to the n-type MOS transistors becomes low. Accordingly, when back bias is applied to a contact region, the back bias potential of the n-type MOS transistors can be controlled uniformly. As a result, the influence of noise from the p-type Si substrate or the p-type well region can be reduced.

3 Claims, 10 Drawing Sheets

U.S. PATENT DOCUMENTS

| | | | |
|---|---|---|---|
| 2006/0220139 A1* | 10/2006 | Tanaka et al. | 257/369 |
| 2006/0267103 A1* | 11/2006 | Tanaka | 257/369 |
| 2008/0150032 A1* | 6/2008 | Tanaka | 257/368 |

FOREIGN PATENT DOCUMENTS

| | | |
|---|---|---|
| JP | 3-030468 A | 2/1991 |
| JP | 04-177874 | 6/1992 |
| JP | 06-295957 | 10/1994 |
| JP | 10-199993 A | 7/1998 |
| WO | WO 2004/032201 A2 | 4/2004 |
| WO | WO 2004/061967 A2 | 7/2004 |

OTHER PUBLICATIONS

USPTO, (KALAM) Election/Restriction Requirement, Feb. 23, 2009, in parent U.S. Appl. No. 11/505,418 [now abandoned].

Japanese Office Action mailed Jun. 14, 2011 for corresponding Japanese Application No. 2006-93275, with partial English-language translation.

* cited by examiner

SEMICONDUCTOR DEVICE

CROSS-REFERENCE TO RELATED APPLICATIONS

This application is a divisional application of U.S. Ser. No. 11/505,418, filed Aug. 17, 2006 now abandoned, which is based upon and claims the benefits of priority from the prior Japanese Patent Application No. 2006-093275, filed on Mar. 30, 2006, the entire contents of the aforementioned parent U.S. application and priority Japanese application are incorporated herein by reference.

BACKGROUND OF THE INVENTION

1. Field of the Invention

This invention relates to a semiconductor device and, more particularly, to a semiconductor device having a triple well structure.

2. Description of the Related Art

With a semiconductor device in which a MOS transistor is used, variation due to noise in GND potential applied to a substrate causes variation in the back bias potential of a well region where the MOS transistor is formed. Accordingly, the threshold of the MOS transistor varies. As a result, the full performance of the semiconductor device cannot be obtained.

For example, a structure (triple well structure) where a p-type well region which is formed in a p-type semiconductor substrate and on which an n-type MOS transistor is formed is surrounded with an n-type well region is proposed as a method for reducing noise (see, for example, Japanese Patent Laid-Open Publication No. Hei3-030468). By adopting this method, noise from the semiconductor substrate can be cut off by a pn junction interface formed in the semiconductor substrate.

With a semiconductor device having a triple well structure, a structure in which a contact region for applying back bias voltage to a p-type well region is formed outside the p-type well region and an n-type well region is proposed to raise an integration level (see, for example, Japanese Patent Laid-Open Publication No. Hei10-199993). With this structure, the formation of hole-like conductive regions in the n-type well region is proposed to secure continuity between the p-type well region and the contact region.

FIG. 10A is a schematic sectional view showing an important part of an example of a semiconductor device having a triple well structure. FIG. 10B is a schematic plan view showing the inside of the example of a semiconductor device having a triple well structure. The schematic sectional view shown in FIG. 10A is taken along the line B-B of FIG. 10B and the schematic plan view shown in FIG. 10B is a sectional view taken along the line A-A of FIG. 10A.

As shown in FIG. 10A, a p-type well region 2 is formed in a p-type silicon (Si) substrate 4. An n-type well region 6 is formed beneath the p-type well region 2 so that it surrounds the p-type well region 2. n-type MOS transistors 1 are formed on the p-type well region 2. As shown in FIG. 10B, hole-like conductive regions 3 are formed in the n-type well region 6.

With the above structure, the p-type well region 2 which is shown in FIG. 10A and on which the n-type MOS transistors 1 are formed is electrically connected to the p-type Si substrate 4 through the hole-like conductive regions 3 shown in FIG. 10B. Accordingly, by applying VBB (back bias voltage) from a contact region 5, the back bias potential of the p-type well region 2 on which the n-type MOS transistors 1 are formed can be controlled. Furthermore, the p-type well region 2 on which the n-type MOS transistors 1 are formed is surrounded with the n-type well region 6, so noise from the p-type Si substrate 4 can be cut off.

With the semiconductor device having the triple well structure as shown in FIGS. 10A and 10B, however, the conductive regions 3 are unevenly distributed in the n-type well region 6. That is to say, the conductive regions 3 are formed in outer portions of the n-type well region 6 to avoid the influence of the injection of minority carriers from the p-type Si substrate 4 into the n-type MOS transistors 1.

As a result, paths from the contact region 5, via the substrate 4, through the conductive regions 3 to the n-type MOS transistors 1 may differ in length, depending on the positions of the n-type MOS transistors 1. For example, a path from the contact region 5, through a conductive region 3a shown in FIG. 10A, to an n-type MOS transistor 1a differs in length from a path from the contact region 5 through a conductive region 3b to an n-type MOS transistor 1b. As a result, the parasitic resistance of the path from the contact region 5 through the conductive region 3b to the n-type MOS transistor 1b is higher than that of the path from the contact region 5 through the conductive region 3a to the n-type MOS transistor 1a.

If such a path the parasitic resistance of which is high exists in the substrate, the back bias potential of the p-type well region 2 cannot uniformly be controlled throughout by supplying back bias from the contact region 5 to the p-type well region 2 on which the n-type MOS transistors 1 are formed. As a result, the n-type MOS transistors 1a, 1b, and 1c cannot be controlled uniformly in a circuit which is made to operate with back bias potential varied. Furthermore, the influence of noise from the p-type Si substrate 4 or noise produced in the p-type well region 2 cannot be reduced significantly.

SUMMARY OF THE INVENTION

The present invention was made under the background circumstances described above. An object of the present invention is to provide a high performance semiconductor device in which uniform control is secured and in which the influence of noise is reduced.

In order to achieve the above object, there is provided a semiconductor device comprising a semiconductor substrate of a first conduction type, a first well region of the first conduction type formed beneath a surface of the semiconductor substrate, transistors formed on the first well region, a second well region of a second conduction type formed in the semiconductor substrate to surround the first well region, and a plurality of conductive regions of the first conduction type which pierce through the second well region and which are arranged so as to make parasitic resistance from the semiconductor substrate to the transistors not extremely high, irrespective of the positions of the transistors, but approximately equal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

A first embodiment of the present invention will be described first.

Figure 1A:
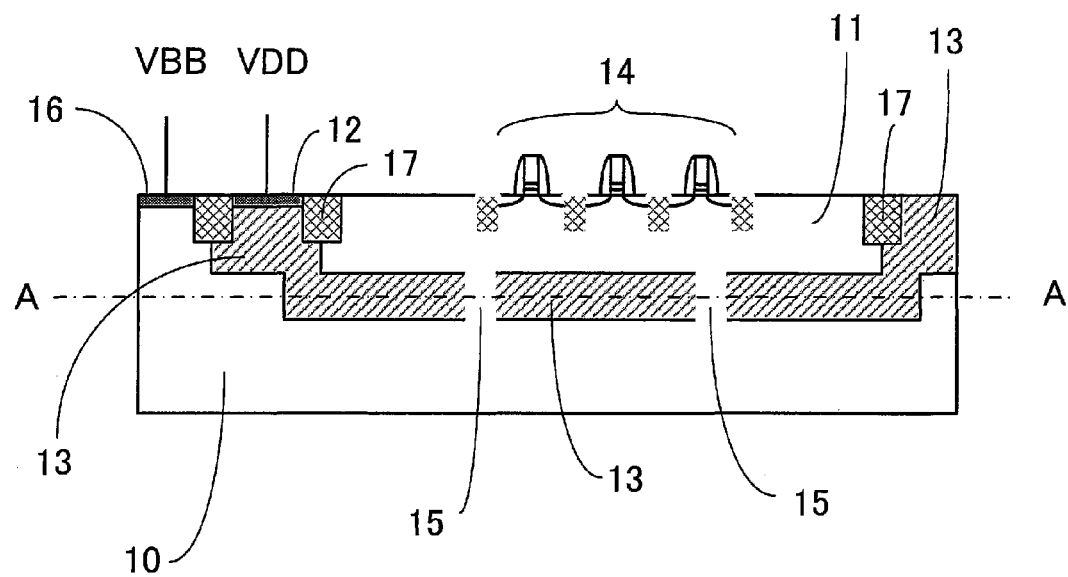
FIG. 1A is a schematic sectional view showing an important part of a semiconductor device according to a first embodiment of the present invention.
Figure 1B:
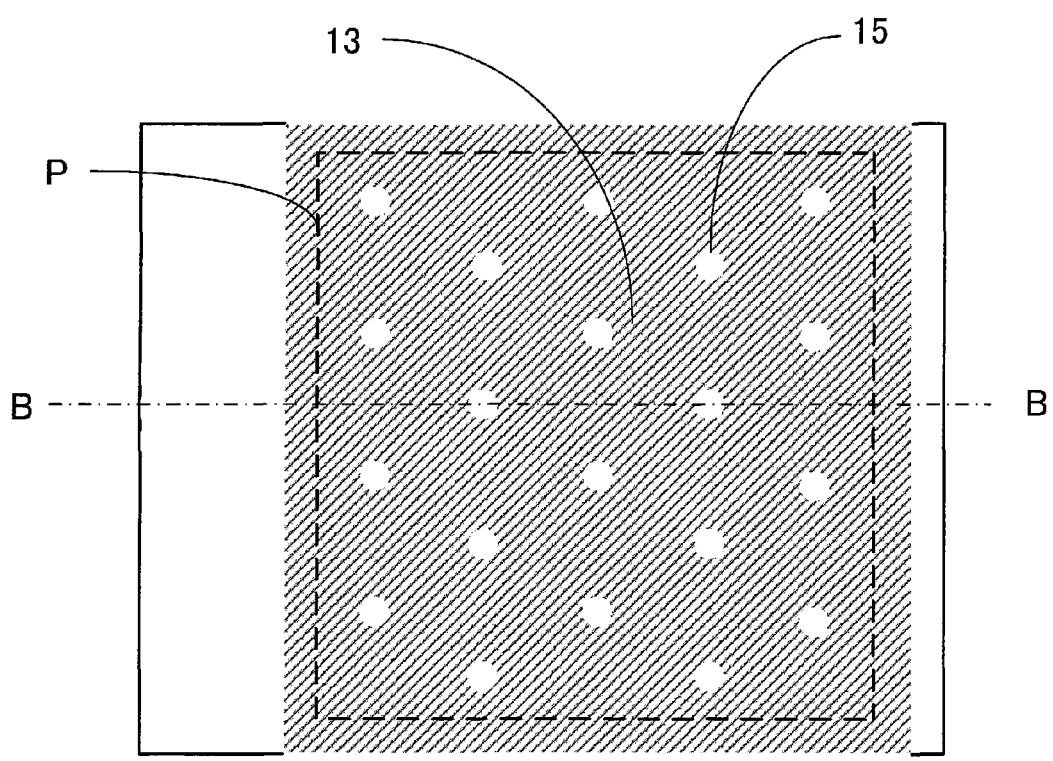
FIG. 1B is a schematic plan view showing the inside of the semiconductor device according to the first embodiment of the present invention.

FIG. 1A is a schematic sectional view showing an important part of a semiconductor device according to a first embodiment of the present invention. FIG. 1B is a schematic plan view showing the inside of the semiconductor device according to the first embodiment of the present invention. The schematic sectional view shown in FIG. 1A is taken along the line B-B of FIG. 1B and the schematic plan view shown in FIG. 1B is a sectional view taken along the line A-A of FIG. 1A.

With the semiconductor device shown in FIG. 1A, a p-type Si substrate 10, for example, is used as a semiconductor substrate of a first conduction type. A p-type well region 11 is formed in the p-type Si substrate 10 defined by isolation regions 17 as a first well region of the first conduction type. A plurality of n-type MOS transistors 14, for example, are formed on the p-type well region 11 as elements of a second conduction type.

An n-type well region 13 is formed in the p-type Si substrate 10 as a second well region of the second conduction type so that it surrounds the p-type well region 11. The n-type well region 13 is connected to a contact region 12. The potential of the n-type well region 13 can be controlled by applying bias (VDD) to the contact region 12.

As stated above, this semiconductor device has a triple well structure including the p-type well region 11 and the n-type well region 13 in the p-type Si substrate 10.

As shown in FIGS. 1A and 1B, a plurality of conductive regions 15 which electrically connect the p-type well region 11 and the p-type Si substrate 10 are formed in portions of the bottom of the n-type well region 13. A dashed line P shown in FIG. 1B indicates the position of the p-type well region 11.

The plurality of conductive regions 15 are formed at regular intervals, like a honeycomb, throughout the n-type well region 13 directly beneath the p-type well region 11.

A contact region 16 for supplying a predetermined back bias to the p-type well region 11 via the plurality of conductive regions 15 is formed on the surface of the p-type Si substrate 10. The plurality of conductive regions 15 are formed of, for example, p-type silicon. For example, when the n-type well region 13 directly beneath the p-type well region 11 is formed by implanting n-type impurity ions at high energy, the corresponding regions should be covered with a resist mask. By doing so, the plurality of conductive regions 15 can be formed.

As stated above, the conduction type of the plurality of conductive regions 15 is the same as that of the p-type well region 11 and the p-type Si substrate 10. Accordingly, electrical connection between the p-type well region 11 and the p-type Si substrate 10 is good and ohmic connection is obtained.

Figure 10A:
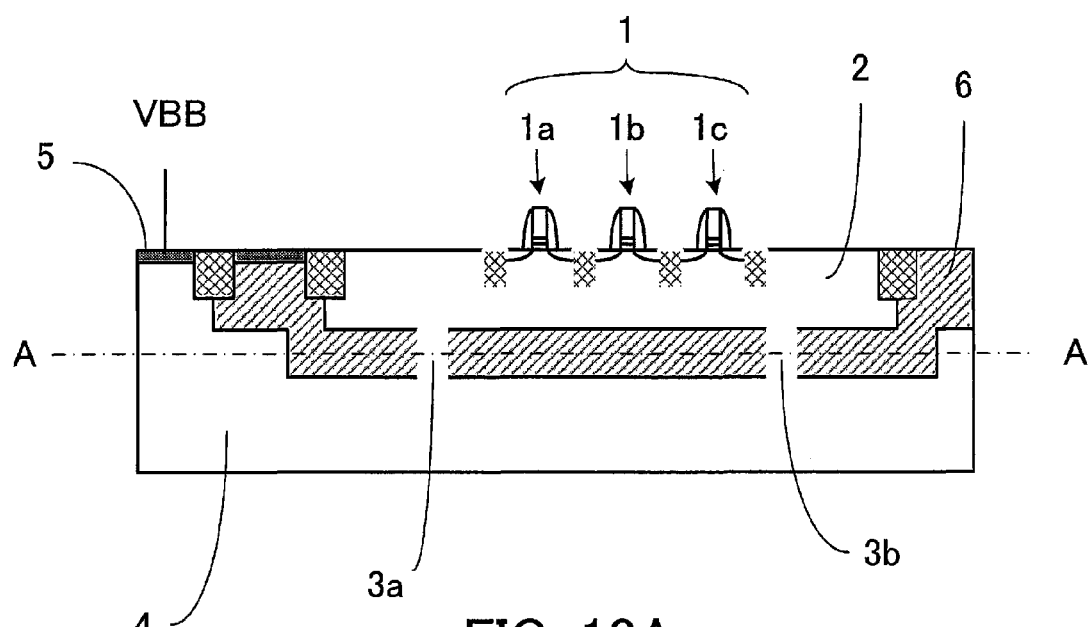
FIG. 10A is a schematic sectional view showing an important part of an example of a semiconductor device having a triple well structure.
Figure 10B:
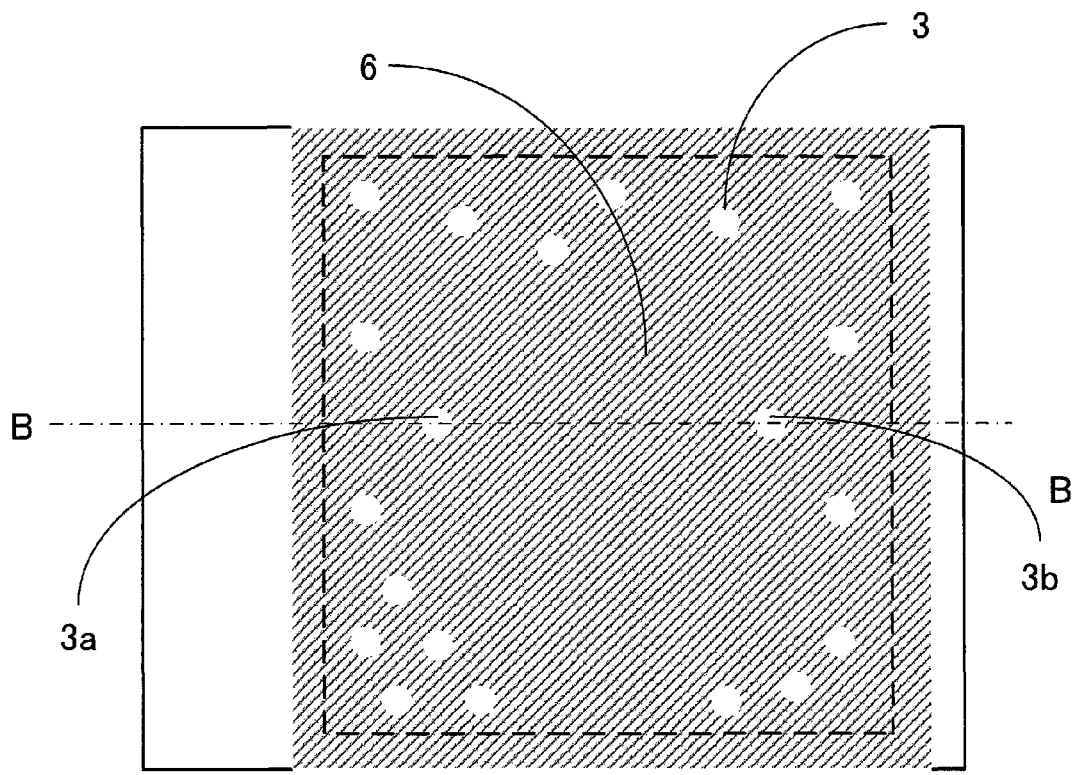
FIG. 10B is a schematic plan view showing the inside of the example of a semiconductor device having a triple well structure.

The plurality of conductive regions 15 are formed in the n-type well region 13 like a honeycomb. Therefore, compared with the arrangement of the conductive regions 3 shown in FIG. 10B, parasitic resistance from the contact region 16 through the plurality of conductive regions 15 to the n-type MOS transistors 14 is low. As a result, when back bias is applied to the contact region 16, the back bias is uniformly supplied to the whole of the p-type well region 11. Accordingly, the back bias potential of the n-type MOS transistors 14 is uniformly controlled regardless of their positions on the p-type well region 11.

The influence of the injection of minority carriers from the p-type Si substrate 10 to the n-type MOS transistors 14 can be avoided by properly adjusting the diameter, the number, the density, or the like of the plurality of conductive regions 15.

A second embodiment of the present invention will now be described.

Figure 2A:
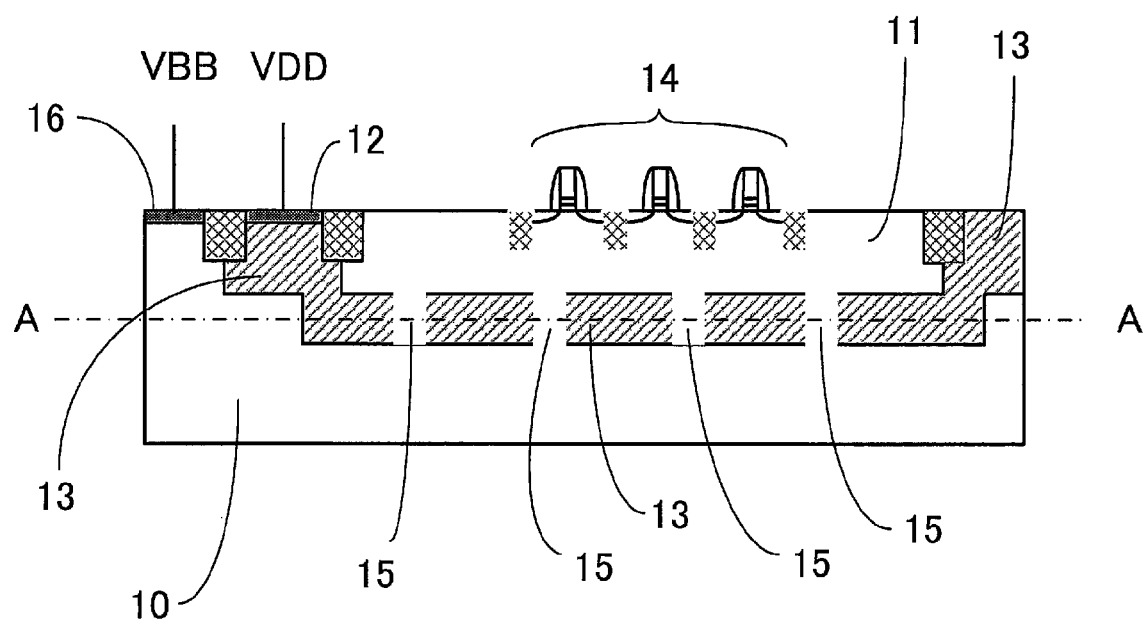
FIG. 2A is a schematic sectional view showing an important part of a semiconductor device according to a second embodiment of the present invention.
Figure 2B:
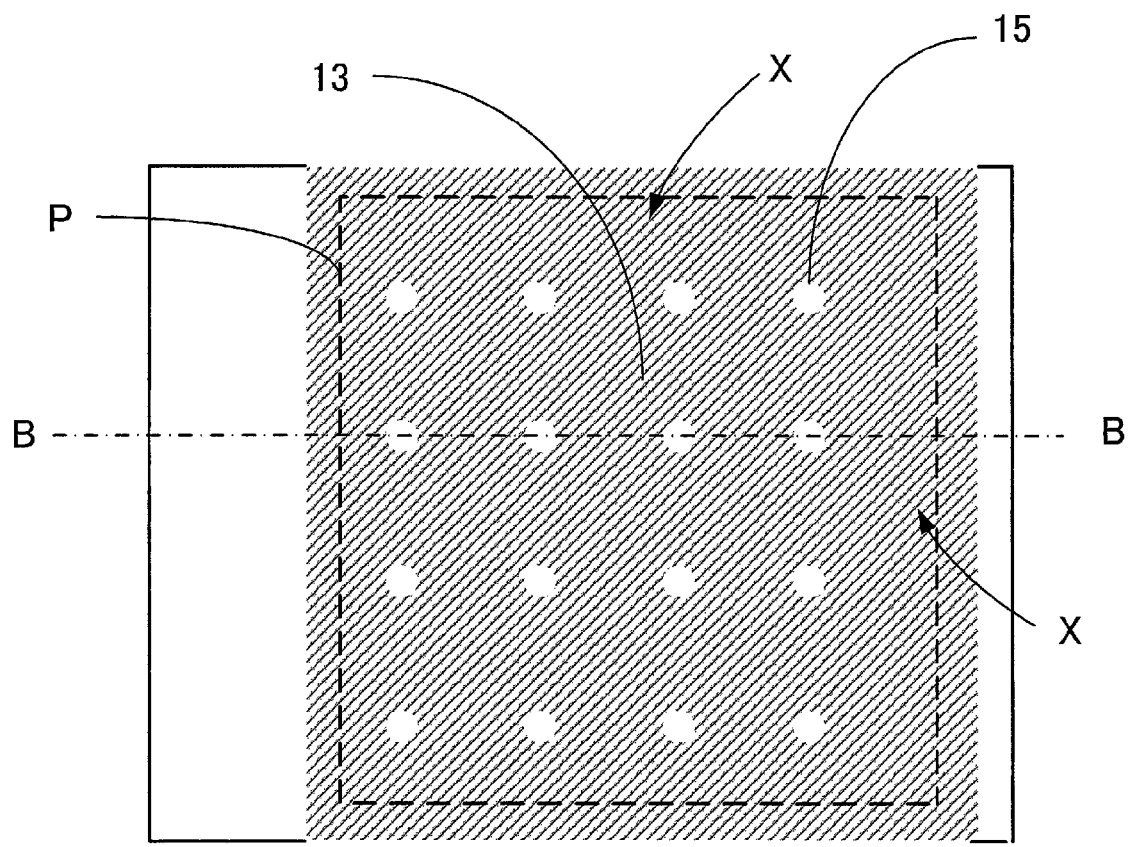
FIG. 2B is a schematic plan view showing the inside of the semiconductor device according to the second embodiment of the present invention.

FIG. 2A is a schematic sectional view showing an important part of a semiconductor device according to the second embodiment of the present invention. FIG. 2B is a schematic plan view showing the inside of the semiconductor device according to the second embodiment of the present invention.

Components in FIGS. 2A and 2B that are the same as those shown in FIGS. 1A and 1B are marked with the same symbols and detailed descriptions of them will be omitted.

In the semiconductor device according to the second embodiment of the present invention, a plurality of conductive regions 15 are arranged like a grid.

In the semiconductor device according to the second embodiment of the present invention, as shown in FIG. 2B, the plurality of conductive regions 15 are formed at regular intervals, like a grid, throughout an n-type well region 13 directly beneath a p-type well region 11.

In this case, the plurality of conductive regions 15 are also formed at regular intervals. Therefore, compared with the arrangement of the conductive regions 3 shown in FIG. 10B, parasitic resistance from a contact region 16 through the plurality of conductive regions 15 to n-type MOS transistors 14 is low. As a result, when back bias is applied to the contact region 16, the back bias is uniformly supplied to the whole of the p-type well region 11. Accordingly, the back bias potential of the n-type MOS transistors 14 is uniformly controlled regardless of their positions on the p-type well region 11.

By the way, if the plurality of conductive regions 15 are arranged like a grid, edge portions (for example, edge portions in FIG. 2B indicated by arrows X) where a conductive region 15 cannot be formed may exist inside a dashed line P shown in FIG. 2B because the plurality of conductive regions 15 are formed at the regular intervals. If such an edge portion exists, parasitic resistance becomes high in an outer region of the p-type well region 11.

In this case, conductive regions 15 are formed at shorter intervals in edge portions inside the dashed line P. This example is shown in FIG. 3.

Figure 3:
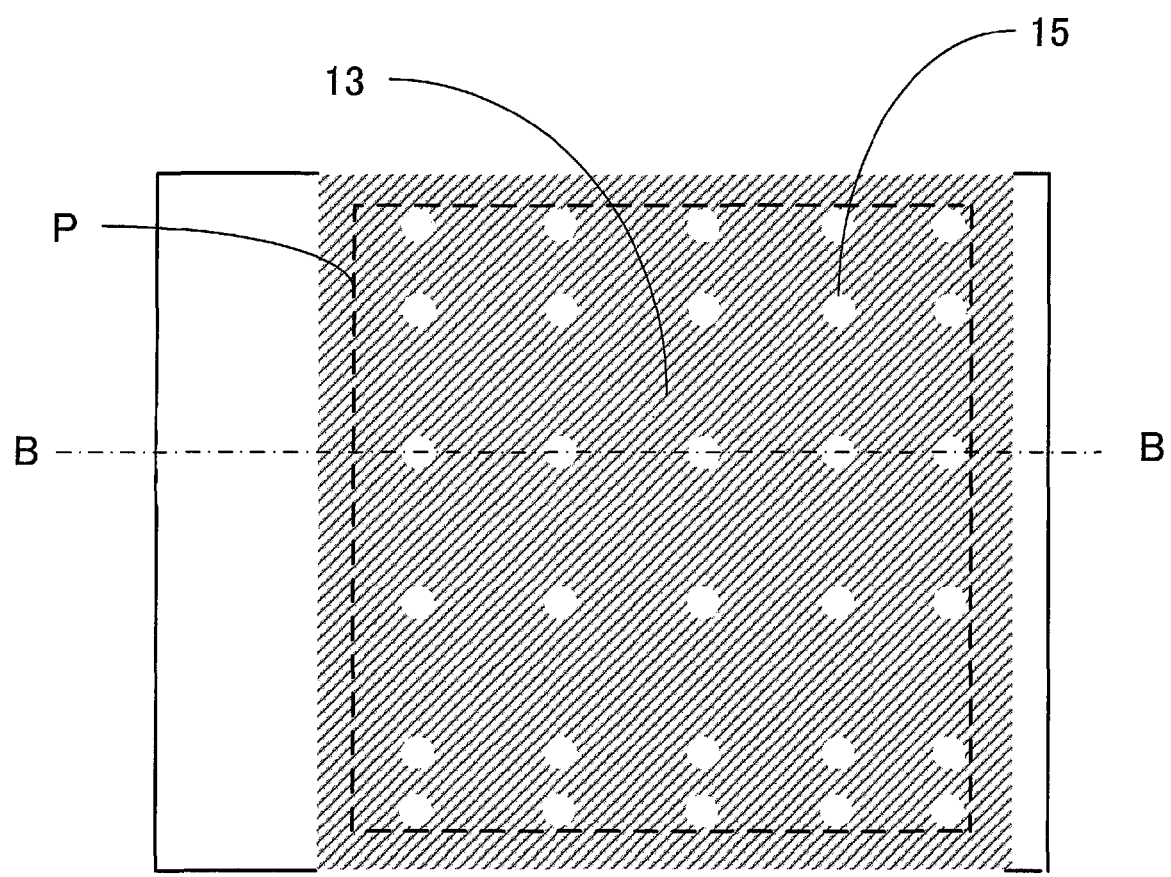
FIG. 3 is a schematic plan view showing the inside of a modification of the semiconductor device according to the second embodiment of the present invention.

FIG. 3 is a schematic plan view showing the inside of a modification of the semiconductor device according to the second embodiment of the present invention. As shown in FIG. 3, conductive regions 15 are formed at intervals shorter than the regular intervals in edge portions inside the dashed line P. That is to say, conductive regions 15 are formed densely in part or all of edge portions of the n-type well region 13, compared with a middle portion of the n-type well region 13.

As stated above, the conductive regions 15 are formed at intervals shorter than the regular intervals in the edge portions inside the dashed line P. As a result, parasitic resistance does not become high in the outer region of the p-type well region 11.

A third embodiment of the present invention will now be described.

Figure 4A:
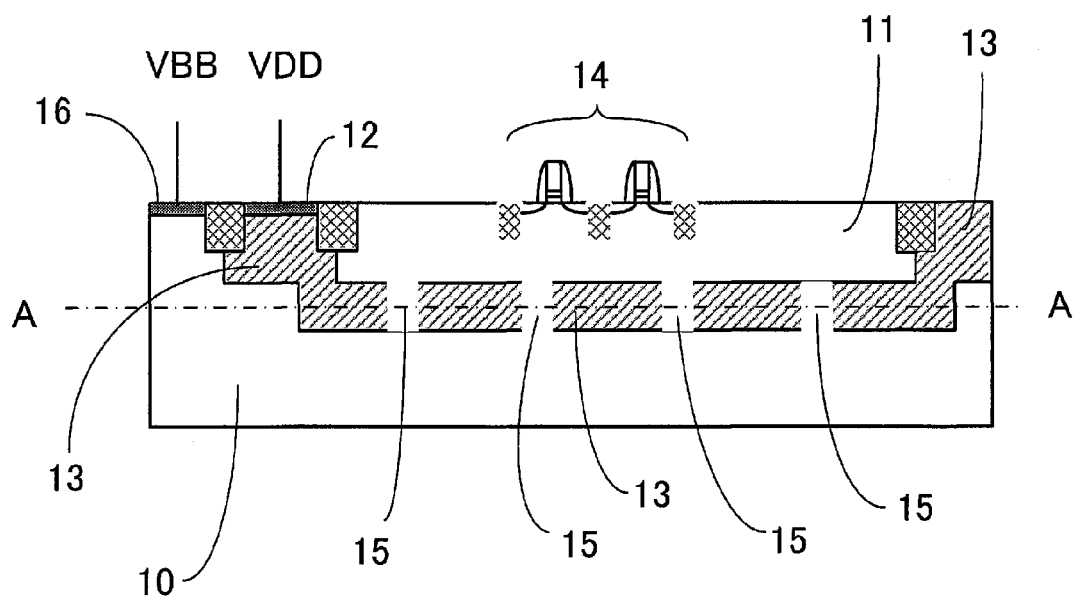
FIG. 4A is a schematic sectional view showing an important part of a semiconductor device according to a third embodiment of the present invention.
Figure 4B:
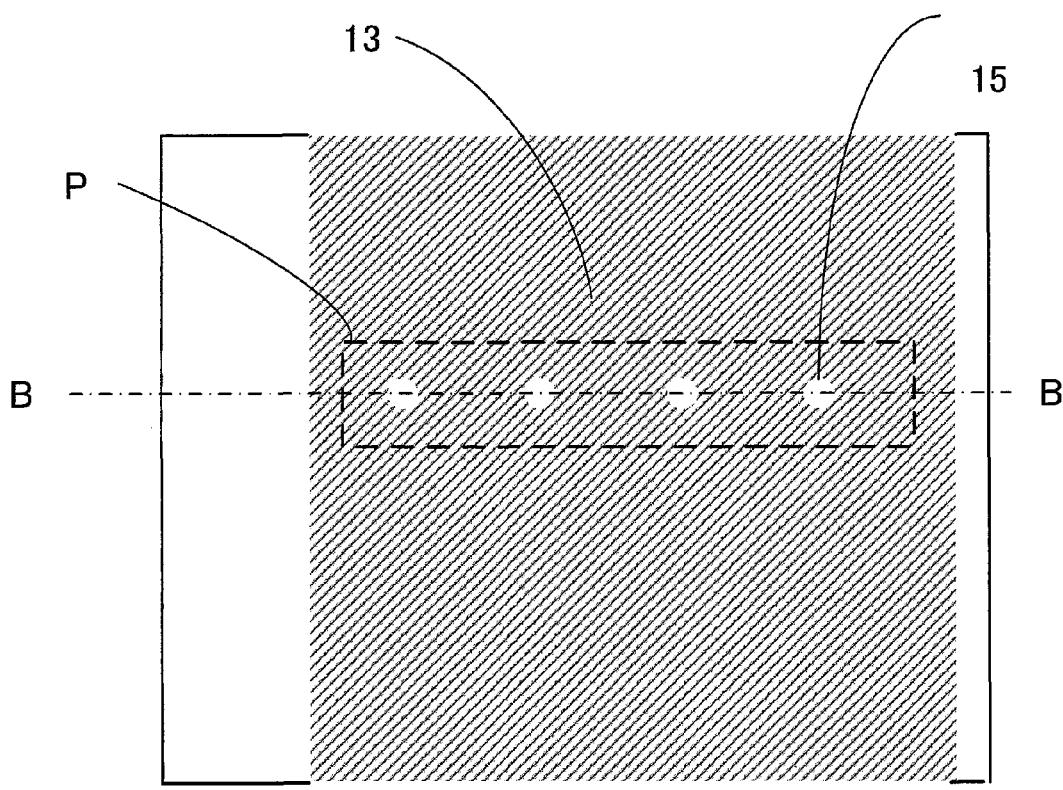
FIG. 4B is a schematic plan view showing the inside of the semiconductor device according to the third embodiment of the present invention.

FIG. 4A is a schematic sectional view showing an important part of a semiconductor device according to the third embodiment of the present invention. FIG. 4B is a schematic plan view showing the inside of the semiconductor device according to the third embodiment of the present invention.

Components in FIGS. 4A and 4B that are the same as those shown in FIGS. 1A and 1B are marked with the same symbols and detailed descriptions of them will be omitted.

In the semiconductor device according to the third embodiment of the present invention, a p-type well region 11 shown in FIG. 4A is formed from left to right like a belt and a plurality of conductive regions 15 are arranged. There are cases where CMOSes or the like are formed on the p-type well region 11 formed like a belt. The position of the beltlike p-type well region 11 is indicated in FIG. 4B by a dashed line P.

As shown in FIG. 4B, if the p-type well region 11 is formed like a belt, the plurality of conductive regions 15 are formed at regular intervals inside the dashed line P.

As stated above, even if the beltlike p-type well region 11 is formed, the plurality of conductive regions 15 are formed at the regular intervals in an n-type well region 13 directly beneath the p-type well region 11. By doing so, parasitic resistance from a contact region 16 through the plurality of conductive regions 15 to n-type MOS transistors 14 becomes low, compared with the arrangement of the conductive regions 3 shown in FIG. 10B.

As a result, when back bias is applied to the contact region 16, the back bias is uniformly supplied to the whole of the beltlike p-type well region 11. Accordingly, the back bias potential of the n-type MOS transistors 14 is uniformly controlled regardless of their positions on the beltlike p-type well region 11.

A fourth embodiment of the present invention will now be described.

Figure 5A:
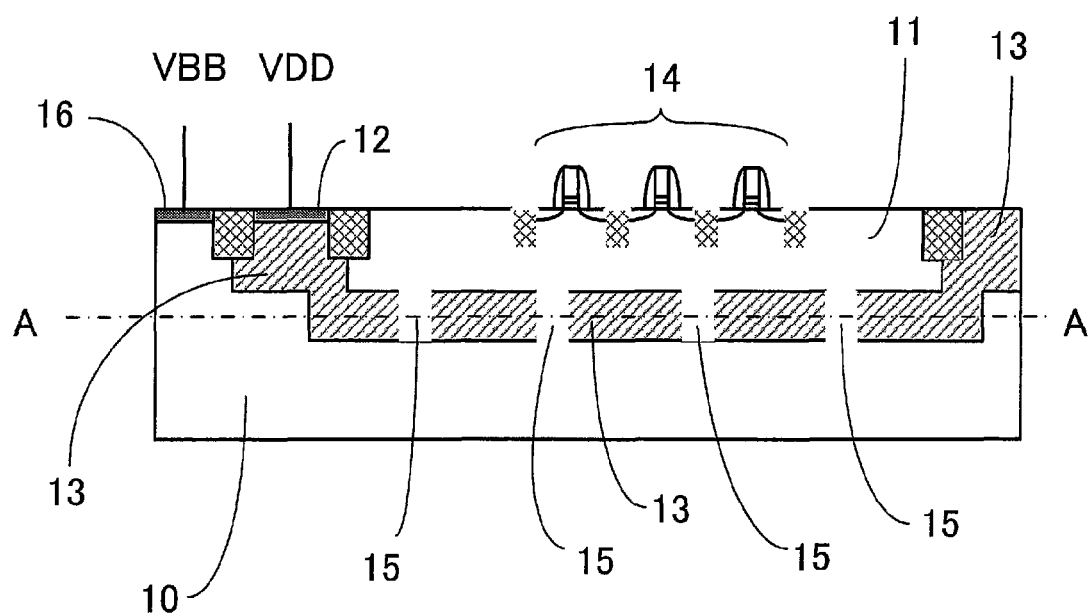
FIG. 5A is a schematic sectional view showing an important part of a semiconductor device according to a fourth embodiment of the present invention.
Figure 5B:
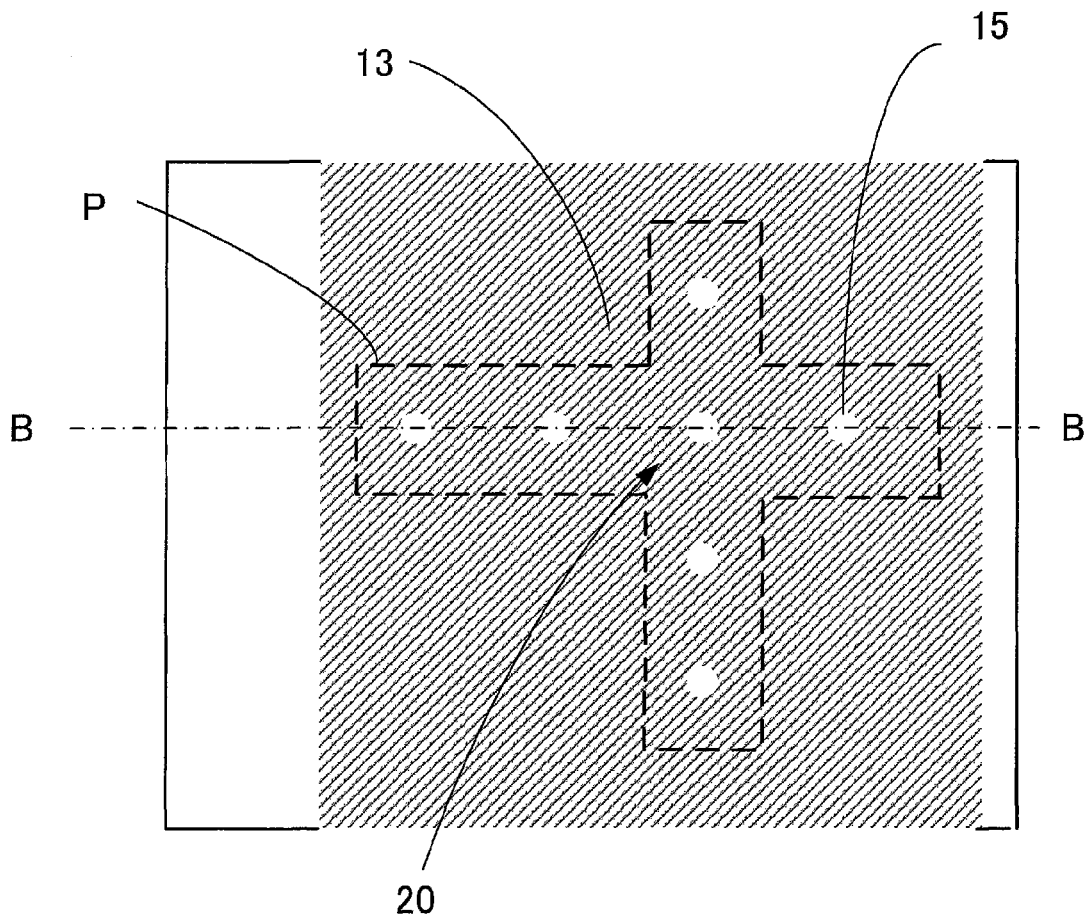
FIG. 5B is a schematic plan view showing the inside of the semiconductor device according to the fourth embodiment of the present invention.

FIG. 5A is a schematic sectional view showing an important part of a semiconductor device according to the fourth embodiment of the present invention. FIG. 5B is a schematic plan view showing the inside of the semiconductor device according to the fourth embodiment of the present invention.

Components in FIGS. 5A and 5B that are the same as those shown in FIGS. 1A and 1B are marked with the same symbols and detailed descriptions of them will be omitted.

In the semiconductor device according to the fourth embodiment of the present invention, a p-type well region 11 shown in FIG. 5A is formed like a cross for reasons of circuit layout and a plurality of conductive regions 15 are arranged. The position of the p-type well region 11 formed like a cross is indicated in FIG. 5B by a dashed line P.

As shown in FIG. 5B, if the p-type well region 11 is formed like a cross, a conductive region 15 is formed in the middle of a cross portion 20 inside the dashed line P. The other conductive regions 15 are formed at regular intervals inside the dashed line P with the above conductive region 15 as reference.

As stated above, even if the p-type well region 11 is formed like a cross for reasons of circuit layout, the plurality of conductive regions 15 are formed at the regular intervals in an n-type well region 13 directly beneath the p-type well region 11. By doing so, parasitic resistance from a contact region 16 through the plurality of conductive regions 15 to n-type MOS transistors 14 becomes low, compared with the arrangement of the conductive regions 3 shown in FIG. 10B.

As a result, when back bias is applied to the contact region 16, the back bias is uniformly supplied to the whole of the crosslike p-type well region 11. Accordingly, the back bias potential of the n-type MOS transistors 14 is uniformly controlled regardless of their positions on the crosslike p-type well region 11.

An example in which a p-type well region 11 is formed like the letter "T" or "L" for reasons of circuit layout will now be described.

Figure 6A:
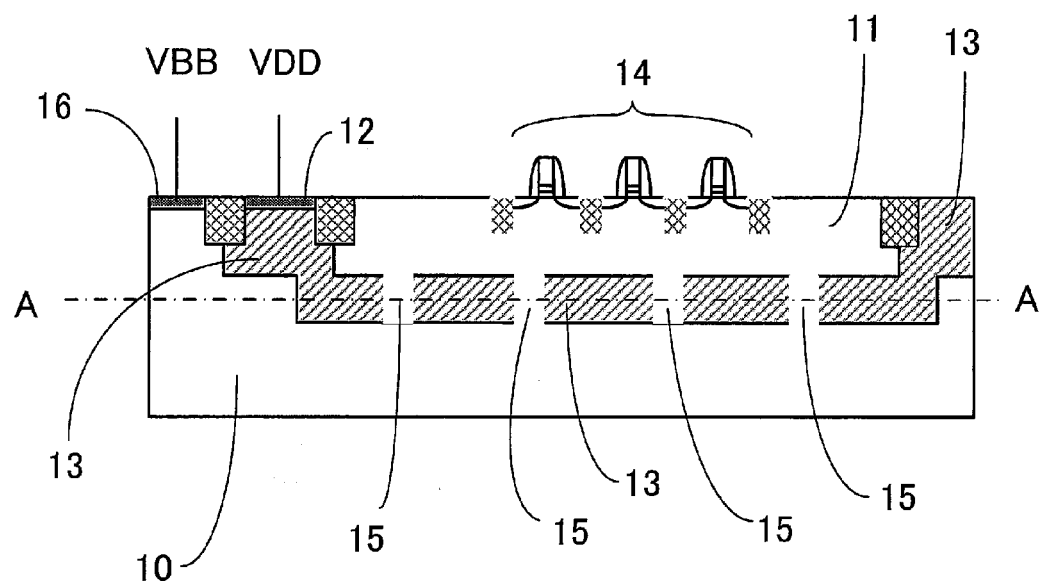
FIG. 6A is a schematic sectional view showing an important part of modification I of the semiconductor device according to the fourth embodiment of the present invention.
Figure 6B:
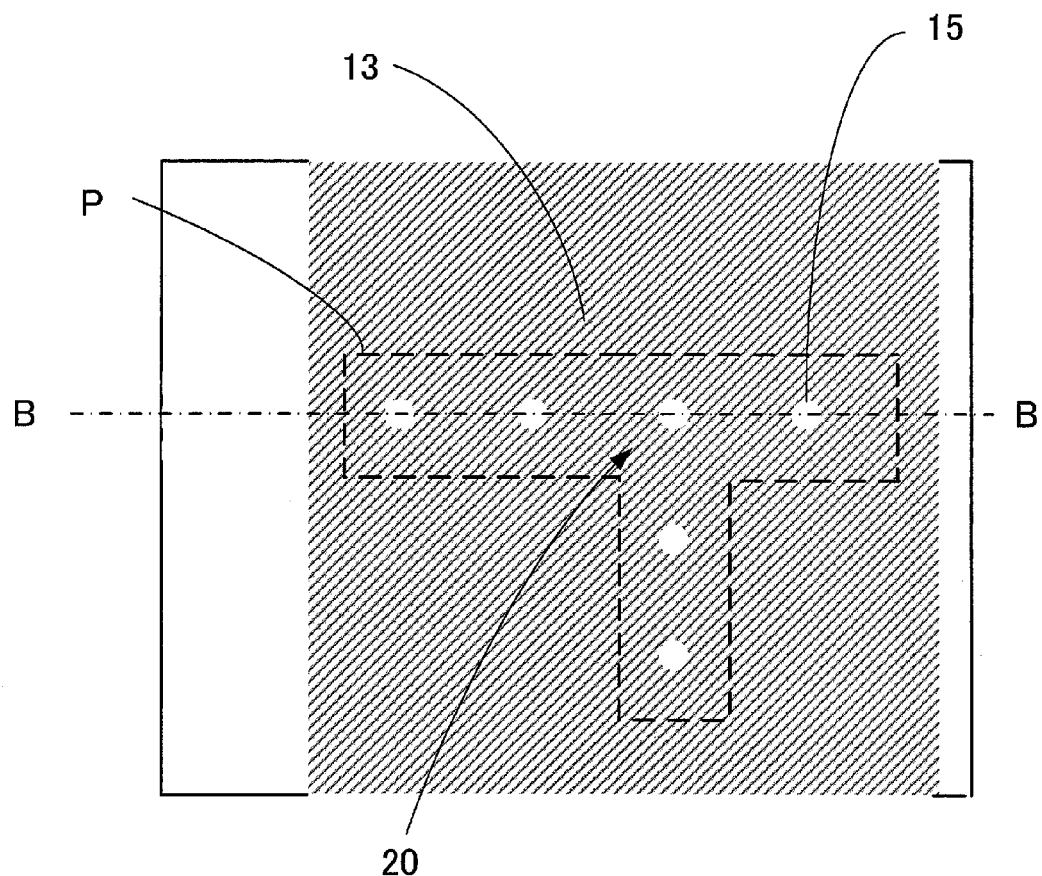
FIG. 6B is a schematic plan view showing the inside of modification I of the semiconductor device according to the fourth embodiment of the present invention.
Figure 7A:
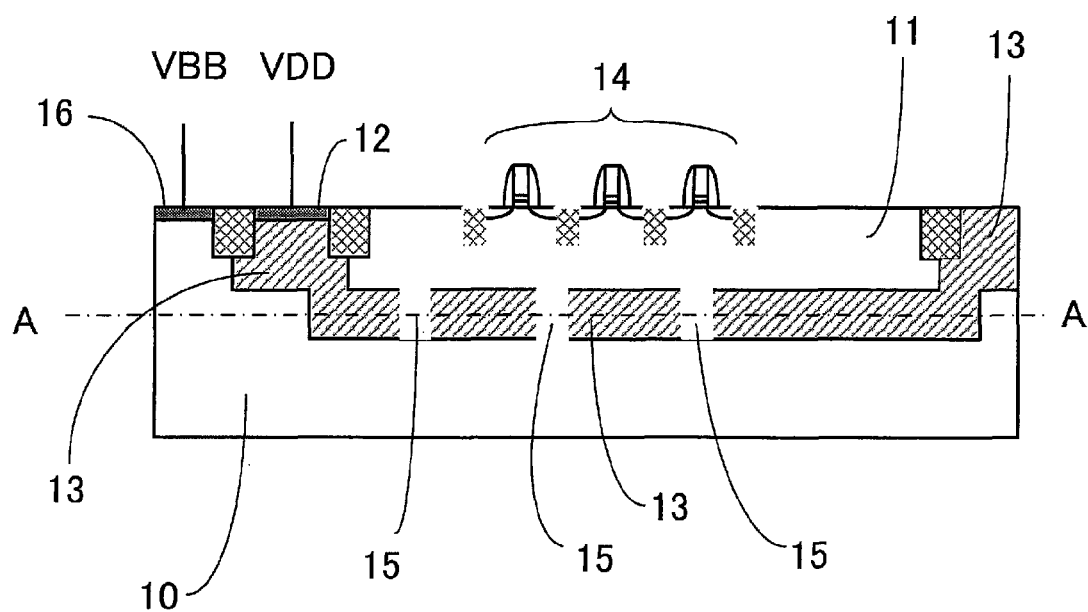
FIG. 7A is a schematic sectional view showing an important part of modification II of the semiconductor device according to the fourth embodiment of the present invention.
Figure 7B:
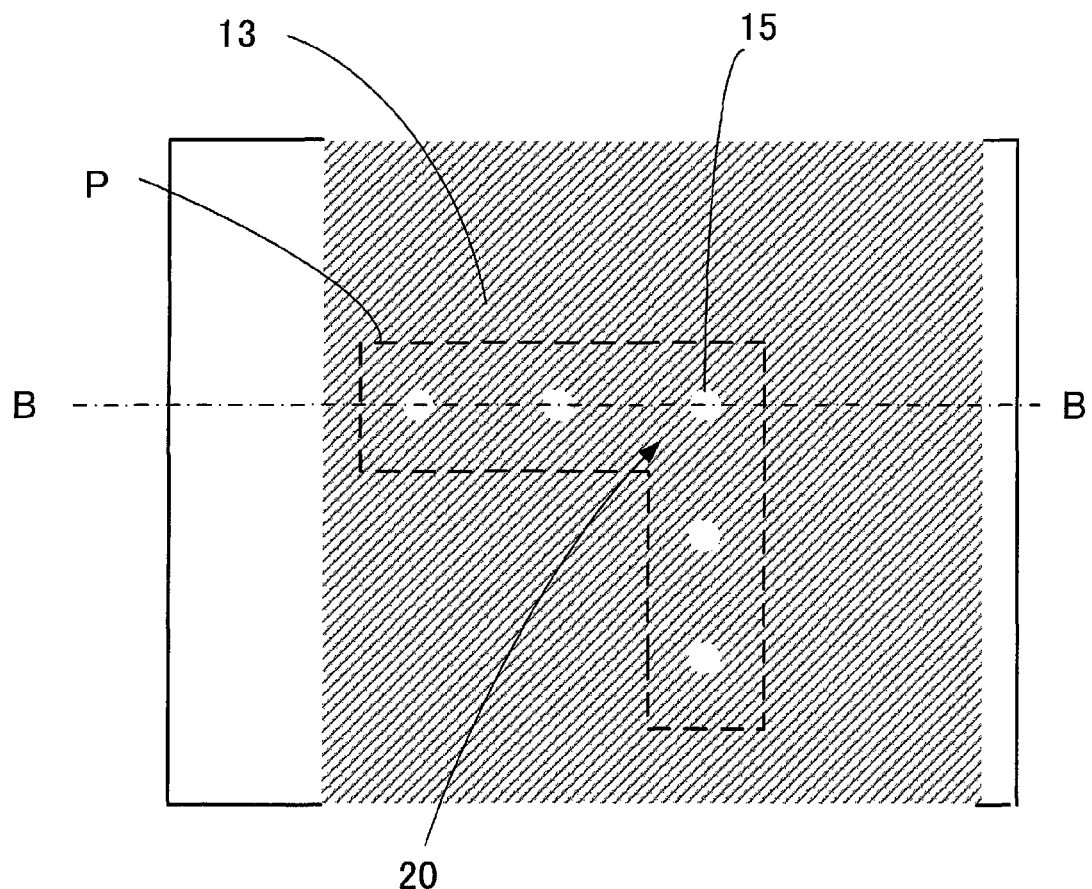
FIG. 7B is a schematic plan view showing the inside of modification II of the semiconductor device according to the fourth embodiment of the present invention.

FIG. 6A is a schematic sectional view showing an important part of modification I of the semiconductor device according to the fourth embodiment of the present invention. FIG. 6B is a schematic plan view showing the inside of modification I of the semiconductor device according to the fourth embodiment of the present invention. FIG. 7A is a schematic sectional view showing an important part of modification II of the semiconductor device according to the fourth embodiment of the present invention. FIG. 7B is a schematic plan view showing the inside of modification II of the semiconductor device according to the fourth embodiment of the present invention.

As shown in FIGS. 6A and 6B, if the p-type well region 11 is formed like the letter "T," a conductive region 15 is formed in the middle of a cross portion 20 inside a dashed line P. Other conductive regions 15 are formed at regular intervals inside the dashed line P with the above conductive region 15 as reference. Furthermore, as shown in FIGS. 7A and 7B, if the p-type well region 11 is formed like the letter "L," a conductive region 15 is formed in the middle of a cross portion 20 inside a dashed line P. Other conductive regions 15 are formed at regular intervals inside the dashed line P with the above conductive region 15 as reference.

As stated above, even if the p-type well region 11 is formed like the letter "T" or "L" for reasons of circuit layout, the plurality of conductive regions 15 are formed at the regular intervals in an n-type well region 13 directly beneath the p-type well region 11. By doing so, parasitic resistance from a contact region 16 through the plurality of conductive regions 15 to n-type MOS transistors 14 becomes low, compared with the arrangement of the conductive regions 3 shown in FIG. 10B.

As a result, when back bias is applied to the contact region 16, the back bias is uniformly supplied to the whole of the p-type well region 11 shown in FIG. 6A or 7A. Accordingly, the back bias potential of the n-type MOS transistors 14 is uniformly controlled regardless of their positions on the p-type well region 11 formed like the letter "T" or "L".

A fifth embodiment of the present invention will now be described.

Figure 8A:
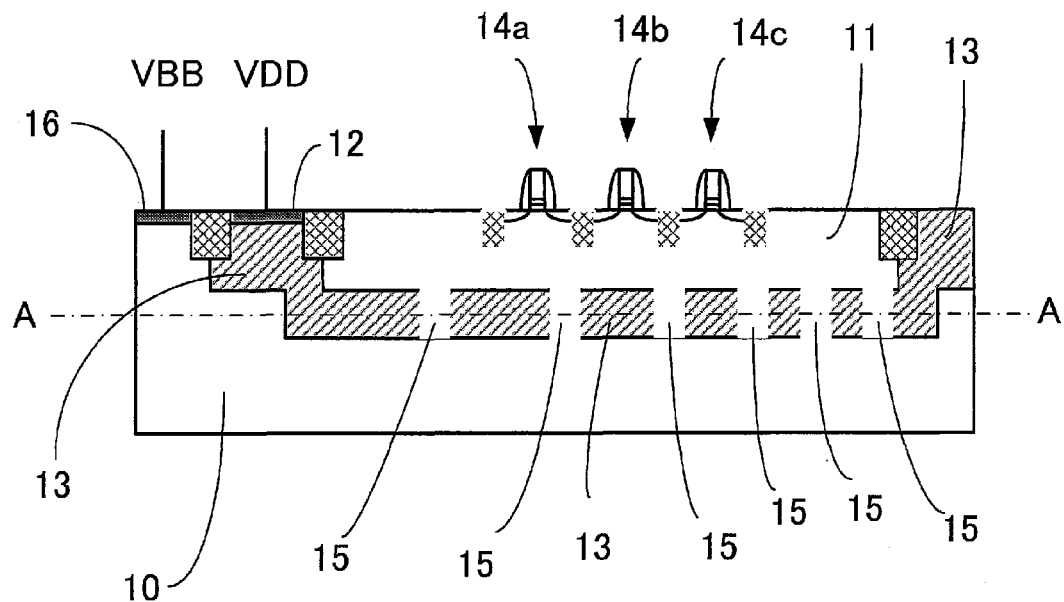
FIG. 8A is a schematic sectional view showing an important part of a semiconductor device according to a fifth embodiment of the present invention.
Figure 8B:
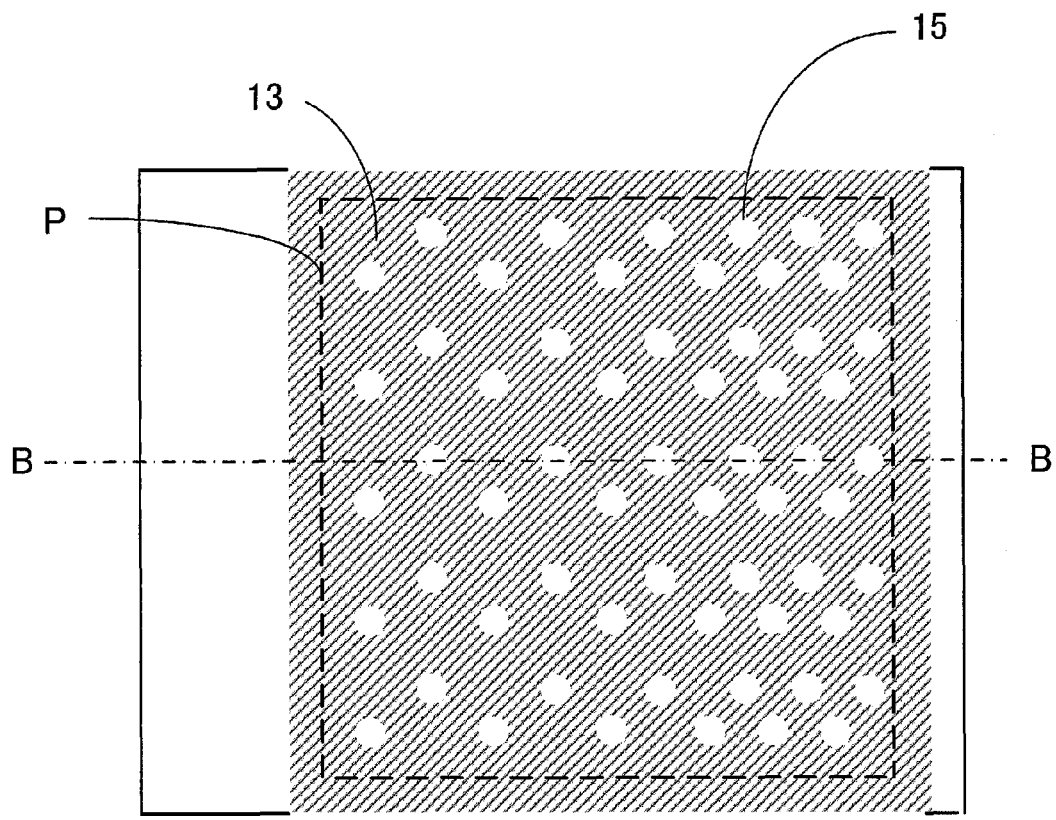
FIG. 8B is a schematic plan view showing the inside of the semiconductor device according to the fifth embodiment of the present invention.

FIG. 8A is a schematic sectional view showing an important part of a semiconductor device according to the fifth embodiment of the present invention. FIG. 8B is a schematic plan view showing the inside of the semiconductor device according to the fifth embodiment of the present invention.

Components in FIGS. 8A and 8B that are the same as those shown in FIGS. 1A and 1B are marked with the same symbols and detailed descriptions of them will be omitted.

In the semiconductor device according to the fifth embodiment of the present invention, the distance between a contact region 16 shown in FIG. 8A and an n-type MOS transistor 14a formed on a p-type well region 11 shown in FIG. 8A differs from the distance between the contact region 16 and an n-type MOS transistor 14b formed on the p-type well region 11 and the distance between the contact region 16 and an n-type MOS transistor 14c formed on the p-type well region 11. The position of the p-type well region 11 is indicated in FIG. 8B by a dashed line P.

As shown in FIG. 8B, conductive regions 15 are arranged at long intervals in a portion of an n-type well region 13 directly under the n-type MOS transistor 14a close to the contact region 16 and conductive regions 15 are arranged at short intervals in a portion of the n-type well region 13 directly under the n-type MOS transistor 14c distant from the contact region 16. That is to say, parasitic resistance from the contact region 16, through the conductive regions 15, to the p-type well region 11 becomes low with an increase in the distance between the contact region 16 and the n-type MOS transistors 14a, 14b and 14c.

As a result, when back bias is applied to the contact region 16, the back bias potential of the n-type MOS transistors 14a, 14b, and 14c is uniformly controlled regardless of the distance between the contact region 16 and the n-type MOS transistors 14a, 14b and 14c.

A sixth embodiment of the present invention will now be described.

Figure 9A:
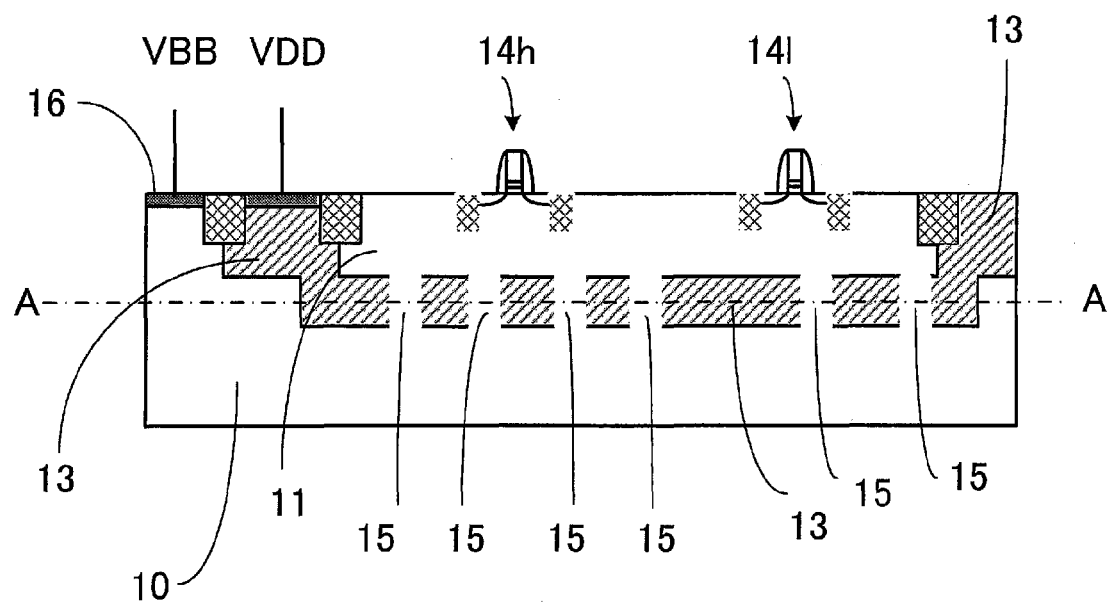
FIG. 9A is a schematic sectional view showing an important part of a semiconductor device according to a sixth embodiment of the present invention.
Figure 9B:
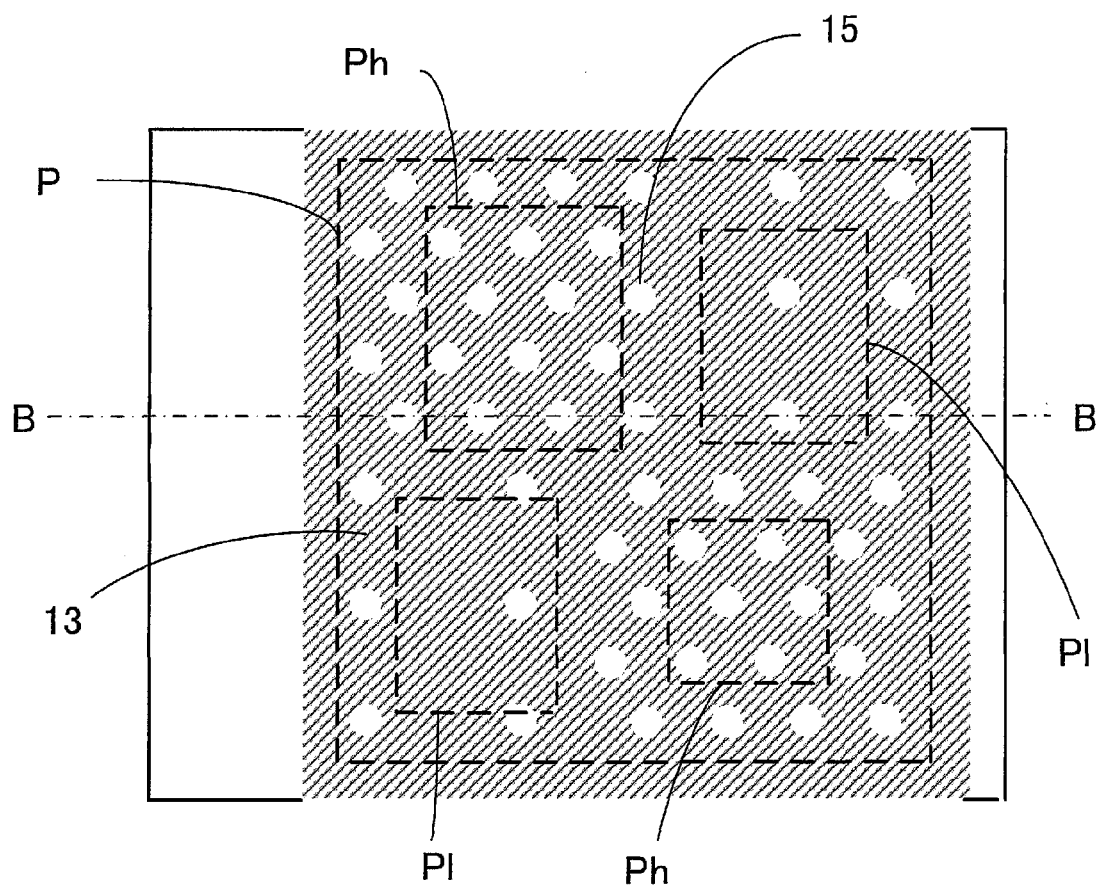
FIG. 9B is a schematic plan view showing the inside of the semiconductor device according to the sixth embodiment of the present invention.

FIG. 9A is a schematic sectional view showing an important part of a semiconductor device according to the sixth embodiment of the present invention. FIG. 9B is a schematic plan view showing the inside of the semiconductor device according to the sixth embodiment of the present invention.

Components in FIGS. 9A and 9B that are the same as those shown in FIGS. 1A and 1B are marked with the same symbols and detailed descriptions of them will be omitted.

In the semiconductor device according to the sixth embodiment of the present invention, n-type MOS transistors 14h and 14l formed on a p-type well region 11 shown in FIG. 9A differ in operation speed. The position of the p-type well region 11 is indicated in FIG. 9B by a dashed line R A portion of the p-type well region 11 where the high-speed n-type MOS transistor 14h can be formed is indicated by a dashed line Ph and a portion of the p-type well region 11 where the low-speed n-type MOS transistor 14l can be formed is indicated by a dashed line Pl.

As shown in FIG. 9B, conductive regions 15 are arranged at short intervals inside the dashed line Ph and conductive regions 15 are arranged at long intervals inside the dashed line Pl. That is to say, parasitic resistance from a contact region 16, through the conductive regions 15, to a portion of the p-type well region 11 where the high-speed n-type MOS transistor 14h can be formed is lower than parasitic resistance from the contact region 16 through the conductive regions 15 to a portion of the p-type well region 11 where the low-speed n-type MOS transistor 14l can be formed.

As a result, when back bias is applied to the contact region 16, the back bias potential of the high-speed n-type MOS transistor 14h can be controlled at a high speed. In addition, the effect of cutting off noise from a substrate is enhanced for the low-speed n-type MOS transistor 14l because the density of the conductive regions 15 is low.

In each of the semiconductor devices according to the above embodiments of the present invention, many pn junction interfaces are formed in a substrate because a plurality of conductive regions 15 are formed in an n-type well region 13. Therefore, these semiconductor devices can be used as semiconductor devices having on-chip capacitors.

In the present invention, a first well region of a first conduction type is formed in a semiconductor substrate of the first conduction type, transistors are formed on the first well region, a second well region of a second conduction type is formed to surround the first well region, and a plurality of conductive regions of the first conduction type are formed in the second well region so as to make parasitic resistance from the semiconductor substrate to the transistors not extremely high, irrespective of the positions of the transistors, but approximately equal.

As a result, a high performance semiconductor device in which back bias can be controlled uniformly in the first well region and in which the influence of noise from the substrate or the first well region can be reduced can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:
1. The semiconductor device comprising:
   a semiconductor substrate of a first conduction type;
   a first well region of the first conduction type formed beneath a surface of the semiconductor substrate;
   transistors formed on the first well region;
   a second well region of a second conduction type formed in the semiconductor substrate to surround the first well region;

a plurality of conductive regions of the first conduction type which pierce through the second well region and which are arranged so as to make parasitic resistance from the semiconductor substrate to the transistors approximately equal;

other transistors which are formed on the first well region and which are different from the transistors; and other plural conductive regions of the first conduction type, in addition to the plurality of conductive regions, which pierce through the second well region and which are arranged so as to make parasitic resistance from the semiconductor substrate to the other transistors approximately equal.

2. The semiconductor device according to claim 1, wherein the transistors differ from the other transistors in operation speed.

3. The semiconductor device according to claim 1, wherein compared with the other plural conductive regions, the plurality of conductive regions are formed densely in the second well region.

* * * * *